(12) United States Patent
Wiggins (10) Patent No.: US 7,495,439 B2
(45) Date of Patent: Feb. 24, 2009

(54) MRI METHOD FOR REDUCING ARTIFACTS USING RF PULSE AT OFFSET FREQUENCY

(75) Inventor: Christopher John Wiggins, Lynn, MA (US)

(73) Assignee: The General Hospital Corporation, Boston, MA (US)

(*) Notice: Subject to any disclaimer, the term of this patent is extended or adjusted under 35 U.S.C. 154(b) by 0 days.

(21) Appl. No.: 11/741,252

(22) Filed: Apr. 27, 2007

(65) Prior Publication Data

US 2008/0265883 A1    Oct. 30, 2008

(51) Int. Cl.
G01V 3/00 (2006.01)
(52) U.S. Cl. .................. 324/309; 324/314; 324/310; 324/313; 324/307
(58) Field of Classification Search ......... 324/300–322; 600/410–422; 427/17; 430/270.15
See application file for complete search history.

(56) References Cited

U.S. PATENT DOCUMENTS

| | | | |
|---|---|---|---|
| 4,689,563 A * | 8/1987 | Bottomley et al. | 324/309 |
| 4,689,564 A * | 8/1987 | Leue et al. | 324/309 |
| 4,694,254 A * | 9/1987 | Vatis et al. | 324/309 |
| 5,245,282 A * | 9/1993 | Mugler et al. | 324/309 |
| 5,347,216 A * | 9/1994 | Foo | 324/309 |
| 6,271,665 B1 * | 8/2001 | Berr et al. | 324/306 |
| 6,307,368 B1 * | 10/2001 | Vasanawala et al. | 324/309 |
| 6,610,351 B2 * | 8/2003 | Shchegolikhin et al. | 427/7 |
| 6,900,632 B2 * | 5/2005 | Uetake | 324/307 |
| 7,279,899 B2 * | 10/2007 | Michaeli et al. | 324/318 |
| 2002/0025490 A1 * | 2/2002 | Shchegolikhin et al. | 430/270.15 |
| 2003/0003053 A1 * | 1/2003 | Uetake | 424/9.3 |
| 2006/0244447 A1 * | 11/2006 | Michaeli et al. | 324/309 |
| 2008/0061780 A1 * | 3/2008 | Yamada et al. | 324/309 |
| 2008/0116891 A1 * | 5/2008 | van der Kouwe et al. | 324/312 |
| 2008/0265883 A1 * | 10/2008 | Wiggins | 324/309 |

FOREIGN PATENT DOCUMENTS

WO    WO 2006/084125 A2    8/2006

OTHER PUBLICATIONS

J. P. Mugler et al in "Three-Dimensional Magnetization-Prepared Rapid Gradient-Echo Imaging (3D MP RAGE)." Magnetic Resonance In Medicine 15, 152-157 (1990).
M. Brant-Zawadzki in "MP RAGE: A Three-Dimensional, T1-Weighted, Gradient-Echo Sequence—Initial Experience in the Brain," Radiology 1992; 182: 769-775.
J. P. Mugler et al. in "T2-Weighted Three-Dimensional MP-RAGE MR Imaging," JMRI 1991:1:731-737.

* cited by examiner

Primary Examiner—Brij Shrivastav
Assistant Examiner—Tiffany A Fetzner
(74) Attorney, Agent, or Firm—Quarles & Brady LLP (57) ABSTRACT

A method for magnetic resonance imaging includes performing a preparatory stage of a MR pulse sequence with an MRI system in which a non-selective RF preparatory pulse is used having a bandwidth such that any spin species having corresponding Larmor frequencies within that bandwidth are affected and the bandwidth is centered at a selected frequency which is offset from a nominal Larmor frequency of the desired spin species being imaged. A time period (TI) elapses during which longitudinal spin magnetization recovers; and then an imaging stage is performed in which an RF excitation pulse is generated to produce transverse spin magnetization of the desired spin species, and in which a set of NMR signals are acquired. An image is reconstructed using the acquired set of NMR signals, and the reconstructed image has reduced artifacts due to $B_0$ field inhomogeneities caused by magnetic susceptibility effects.

9 Claims, 6 Drawing Sheets

— ASSYMETRIC SPECTRUM
--- NARROW INVERSION PULSE

FIG. 7

— ASSYMETRIC SPECTRUM
·—·— BROAD INVERSION PULSE
·—— NARROW INVERSION PULSE

FIG. 8

— ASSYMETRIC SPECTRUM
·—·— SHIFTED INVERSION PULSE
·—— NARROW INVERSION PULSE

Fig. 9

MRI METHOD FOR REDUCING ARTIFACTS USING RF PULSE AT OFFSET FREQUENCY

BACKGROUND OF THE INVENTION

The field of the invention is magnetic resonance imaging (MRI) and in particular a method for reducing image artifacts using an RF preparatory pulse which is shifted in frequency from a nominal Larmor frequency corresponding to the spin species being imaged.

Any nucleus which possesses a magnetic moment attempts to align itself with the direction of a magnetic field in which it is located. In doing so, however, the nucleus precesses around this direction at a characteristic frequency that is termed the Larmor frequency, $f_0$, and which is dependent on the strength of the magnetic field and on the gyromagnetic constant γ of the nucleus: i.e., $f_0=\gamma B$, where γ=42.56 MHz/T for hydrogen nuclei, and B is the strength of the magnetic field. Hydrogen ($H^1$) is the spin species of choice for most MRI applications and for example, the Larmor frequency $f_0$ for hydrogen nuclei in a 1.5 T magnetic field is 63.8 MHz.

MRI takes advantage of this phenomenon by subjecting an object to be imaged (such as human tissue) to a uniform magnetic field (polarizing field $B_0$) along a z direction, and then subjecting the object to a magnetic field (excitation field $B_1$) that is in the x-y plane and that is near the Larmor frequency such that the net aligned moment, Mz, may be rotated, or "tipped", into the x-y plane to produce a net transverse magnetic moment Mt. After the excitation signal $B_1$ (RF excitation pulse) is terminated, a nuclear magnetic resonance (NMR) signal is emitted by the excited spins and this signal is detected.

In MR systems, the excited spins (typically hydrogen) induce an oscillating sine wave signal in a receiving coil. The frequency of this signal is near the Larmor frequency, and its initial amplitude, $A_0$, is determined by the magnitude of the transverse magnetic moment Mt. The amplitude, A, of the emitted NMR signal decays in an exponential fashion with time, t. The decay constant 1/T*2 depends on the homogeneity of the magnetic field and on T2, which is referred to as the "spin-spin relaxation" constant, or the "transverse relaxation" constant. The T2 constant is inversely proportional to the exponential rate at which the aligned precession of the spins would dephase after removal of the excitation signal B1 in a perfectly homogeneous field. The practical value of the T2 constant is that tissues have different T2 values and this can be exploited as a means of enhancing the contrast between such tissues.

Another important factor which contributes to the amplitude A of the NMR signal is referred to as the spin-lattice relaxation process that is characterized by the time constant T1. It describes the recovery of the net magnetic moment M to its equilibrium value along the axis of magnetic polarization (z). The T1 time constant is longer than T2, much longer in most substances of medical interest. As with the T2 constant, the difference in T1 between tissues can be exploited to provide image contrast.

When utilizing the received NMR signals to produce images, it is necessary to elicit NMR signals from specific locations in the subject, which is accomplished by employing magnetic fields (Gx, Gy, and Gz) that have the same direction as the polarizing field B0, but which have a gradient along the respective x, y and z axes. By controlling the strength of these gradients during each NMR cycle, the spatial distribution of spin excitation can be controlled and the location of the resulting NMR signals can be identified. The resulting set of received NMR signals can be digitized and processed to reconstruct an image of the object using one of many well known reconstruction techniques.

High field MRI, with $B_0$ field strengths of 3 T or higher, is rapidly winning acceptance in both clinical and research programs. High field MRI offers many benefits, while simultaneously presenting many research and design problems. The main benefit of high field MRI is increased signal to noise ratio (SNR), which increases linearly with static field strength. This increase provides significant advantages in terms of spatial, temporal, and spectral resolution. However, specific absorption rates (SAR) limits are imposed which restrict the amount of RF applied to a subject, and these SAR limits are more easily exceeded with high magnetic field strengths.

The time required to acquire sufficient NMR signals to reconstruct an image is an important consideration, since reduced scan time increases patient throughput, improves patient comfort, and improves image quality by reducing motion artifacts. There is a class of pulse sequences that have a very short repetition time (TR) and result in complete scans that can be conducted in seconds rather than minutes.

The concept of acquiring NMR imaging data in a short time period has been known since 1977 when the echo-planar pulse sequence was proposed by Peter Mansfield (J. Phys. C.10: L55-L58, 1977). In contrast to standard pulse sequences, the echo-planar pulse sequence produces a series of gradient-recalled NMR echo signals for each RF excitation pulse. These NMR signals are separately phase encoded so that a set of views sufficient to reconstruct an image can be acquired in a single pulse sequence of 20 to 100 milliseconds in duration. The advantages of echo-planar imaging ("EPI") are well known.

A variant of the echo-planar imaging method is the Rapid Acquisition Relaxation Enhanced (RARE) sequence which is described by J. Hennig et al. in an article in Magnetic Resonance in Medicine 3,823-833 (1986) entitled "RARE Imaging: A Fast Imaging Method for Clinical MR." The primary difference between the RARE sequence and the EPI sequence lies in the manner in which NMR echo signals are produced. The RARE sequence utilizes RF refocused echoes generated from a Carr-Purcell-Meiboom-Gill sequence, while EPI methods employ gradient recalled echoes.

Both of these "fast spin echo" imaging methods involve the acquisition of multiple echo signals from a single RF excitation pulse in which each acquired echo signal is separately phase encoded. Each pulse sequence, or "shot", therefore results in the acquisition of a plurality of views and single shot scans are commonly employed with the EPI method. However, a plurality of shots is typically employed to acquire a complete set of image data when the RARE fast spin echo sequence is employed. For example, a RARE pulse sequence might acquire 8 or 16 separate echo signals per shot, and an image requiring 256 views would, therefore, require 32 or 16 shots, respectively.

Pulse sequences based on spin echo, RARE, and EPI often employ a two stage pulse sequence with a preparatory stage followed by a time delay prior to an imaging stage. One such pulse sequence is referred to as an inversion recovery (IR) pulse sequence. Conceptually, the first or preparatory stage, referred to as the "IR module," includes an RF preparatory or inversion pulse, an optional spoiler gradient, and any slice-selection gradient (should the RF preparatory pulse be non-selective). The second or imaging stage of the IR pulse sequence, referred to as the "host sequence," begins with an RF excitation pulse after a time delay referred to as an inversion time (TI) from the RF preparatory pulse, and typically includes a self-contained pulse sequence, such as a spin-echo sequence, gradient echo sequence, RARE sequence, EPI sequence, or the like.

Spin echo, RARE, and EPI pulse sequences often include an IR module for each host sequence. However, when fast gradient echo sequences are employed, the short TR does not allow time for a full IR module to be included before every host sequence. As described by J. P. Mugler et al in "Three-Dimensional Magnetization-Prepared Rapid Gradient-Echo Imaging (3D MP RAGE)," Magnetic Resonance In Medicine 15, 152-157 (1990); by M. Brant-Zawadzki in "MP RAGE: A Three-Dimensional, T1-Weighted, Gradient-Echo Sequence—Initial Experience in the Brain," Radiology 1992; 182: 769-775; and by J. P. Mugler et al. in "T2-Weighted Three-Dimensional MP-RAGE MR Imaging," JMRI 1991:1: 731-737; a plurality of gradient-echo pulse sequences can be performed after each IR module. In particular, for T1-weighted imaging, a non-selective RF preparatory pulse (having an angle selected from 0 to 180 degrees) is applied and followed by a TI interval. After the TI interval, a series of fast gradient-recalled echo sequences are performed to acquire a corresponding series of phase-encoded lines in k-space. Following a recovery period, the process is repeated as necessary to fully sample k-space.

SUMMARY OF THE INVENTION

One aspect of the invention relates to a realization that magnetic susceptibility differences, such as near tissue/air interfaces in the brain, produce $B_0$ magnetic field inhomogeneities which result in asymmetric Larmor frequency distributions of a spin species to be imaged.

Thus, an object of the present invention is to produce improved MR images, i.e., images having fewer artifacts by using a two-stage pulse sequence including a preparation stage using a non-selective RF preparatory pulse having a center frequency which is shifted relative to a nominal Larmor frequency of the spin species being imaged. The pulse sequence also includes an imaging stage for acquiring a set of NMR signals from which an image can be reconstructed. The reconstructed image includes fewer artifacts compared to an image reconstructed using NMR signals acquired using the same MR pulse sequence and the same bandwidth of the RF preparatory pulse, but with the RF preparatory pulse having a center frequency corresponding to the nominal Larmor frequency of the desired spin species being imaged.

Various other features of the present invention will be made apparent from the following detailed description and the drawings.

DESCRIPTION OF THE PREFERRED EMBODIMENT

Figure 1:
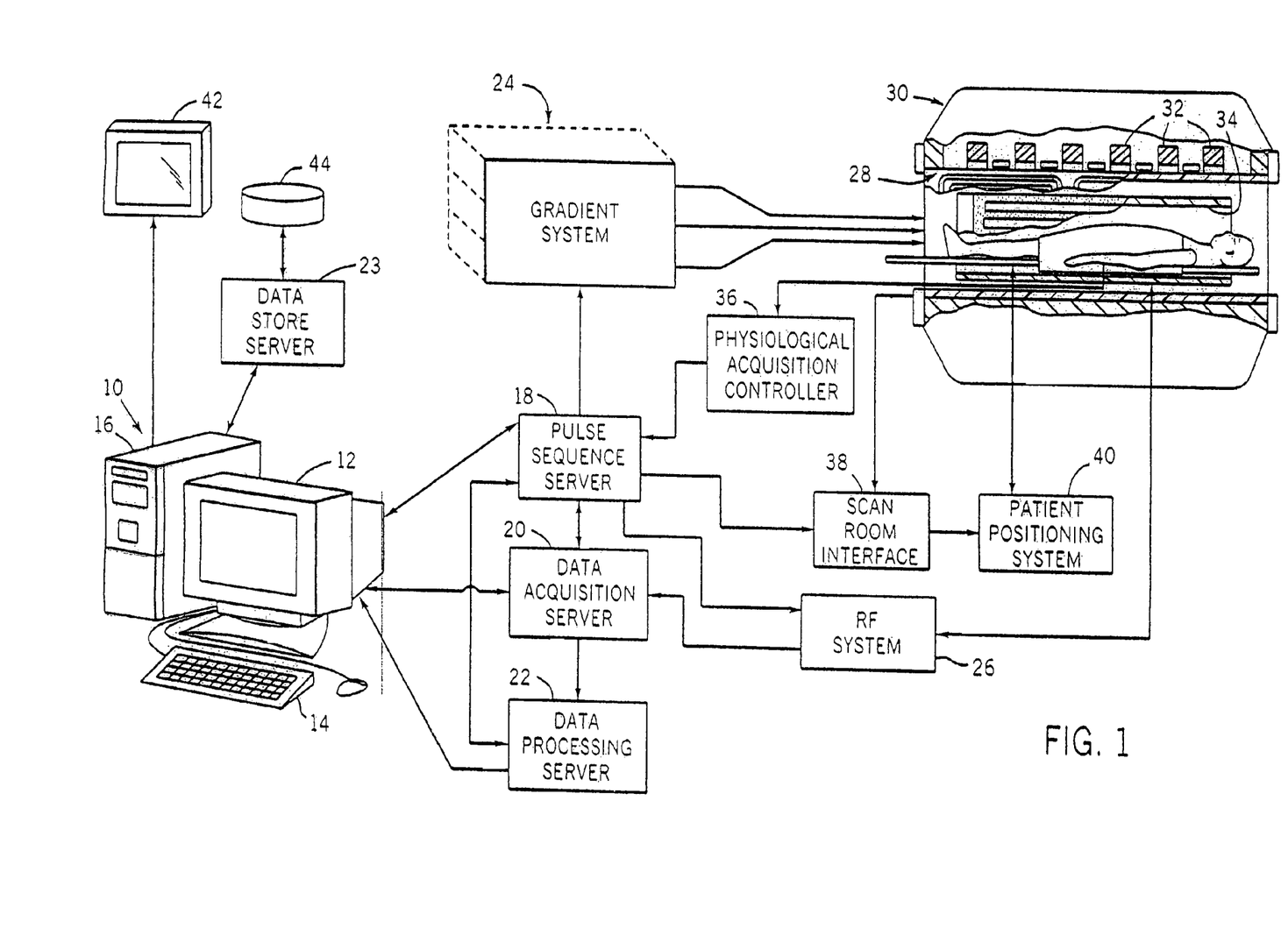
FIG. 1 is a block diagram of an MRI system which employs the present invention.

Referring particularly to FIG. 1, the preferred embodiment of the invention is employed in an MRI system having a $B_0$ field of 7.0 T using a modified MP-RAGE pulse sequence, i.e., one where an RF preparation pulse is shifted in frequency from a nominal Larmor frequency. The MRI system includes a workstation 10 having a display 12 and a keyboard 14. The workstation 10 includes a processor 16 which is a commercially available programmable machine running a commercially available operating system. The workstation 10 provides the operator interface that enables scan prescriptions to be entered into the MRI system.

The workstation 10 is coupled to four servers: a pulse sequence server 18; a data acquisition server 20; a data processing server 22, and a data store server 23. In the preferred embodiment, the data store server 23 is performed by the workstation processor 16 and associated disc drive interface circuitry. The server 18 is performed by a separate processor and the servers 20 and 22 are combined in a single processor. The workstation 10 and each processor for the servers 18, 20 and 22 are connected to an Ethernet communications network. This network conveys data that is downloaded to the servers 18, 20 and 22 from the workstation 10, and it conveys data that is communicated between the servers.

The pulse sequence server 18 functions in response to instructions downloaded from the workstation 10 to operate a gradient system 24 and an RF system 26. Gradient waveforms necessary to perform the prescribed scan are produced and applied to the gradient system 24 that excites gradient coils in an assembly 28 to produce the magnetic field gradients $G_x$, $G_y$ and $GH_z$ used for position encoding NMR signals. The gradient coil assembly 28 forms part of a magnet assembly 30 that includes a polarizing magnet 32 and a whole-body RF coil 34 and/or one or more local coils such as a multi-channel head coil (not shown).

In a preferred embodiment, RF excitation waveforms are applied to the head coil by the RF system 26 to perform the prescribed magnetic resonance pulse sequence. Responsive NMR signals detected by the coil 35 are received by the RF system 26, amplified, demodulated, filtered and digitized under direction of commands produced by the pulse sequence server 18. The RF system 26 includes an RF transmitter for producing a wide variety of RF pulses used in MR pulse sequences. The RF transmitter is responsive to the scan prescription and direction from the pulse sequence server 18 to produce RF pulses of the desired frequency, phase and pulse amplitude waveform. Generated RF pulses may also be applied to the whole body RF coil 34 or to one or more local coils or coil arrays.

The RF system 26 also includes one or more RF receiver channels. Each RF receiver channel includes an RF amplifier that amplifies the NMR signal received by the coil to which it is connected and a quadrature detector which detects and digitizes the I and Q quadrature components of the received NMR signal. The magnitude of the received NMR signal may thus be determined at any sampled point by the square root of the sum of the squares of the I and Q components:

$$M=\sqrt{I^2+Q^2} \qquad (1),$$

and the phase of the received NMR signal may also be determined:

$$\Phi=\tan^{-1}Q/I \qquad (2).$$

The pulse sequence server 18 also optionally receives patient data from a physiological acquisition controller 36. The controller 36 receives signals from a number of different sensors connected to the patient, such as ECG signals from electrodes or respiratory signals from a bellows. Such signals are typically used by the pulse sequence server 18 to synchronize, or "gate" the performance of the scan with the subject's respiration or heart beat.

The pulse sequence server 18 also connects to a scan room interface circuit 38 that receives signals from various sensors associated with the condition of the patient and the magnet system. It is also through the scan room interface circuit 38 that a patient positioning system 40 receives commands to move the patient to desired positions during the scan.

The digitized NMR signal samples produced by the RF system 26 are received by the data acquisition server 20. The data acquisition server 20 operates in response to instructions downloaded from the workstation 10 to receive the real-time NMR data and provide buffer storage such that no data is lost by data overrun. In some scans, the data acquisition server 20 does little more than pass the acquired NMR data to the data processor server 22. However, in scans that require information derived from acquired NMR data to control the further performance of the scan, the data acquisition server 20 is programmed to produce such information and convey it to the pulse sequence server 18. For example, during prescans NMR data is acquired and used to calibrate the pulse sequence performed by the pulse sequence server 18. Also, navigator signals may be acquired during a scan and used to adjust RF or gradient system operating parameters or to control the view order in which the k-space is sampled. And, the data acquisition server 20 may be employed to process NMR signals used to detect the arrival of a contrast agent in an MRA scan. In all these examples, the data acquisition server 20 acquires NMR data and processes it in real-time to produce information which is used to control the scan.

The data processing server 22 receives NMR data from the data acquisition server 20 and processes it in accordance with instructions downloaded from the workstation 10. Such processing may include, for example: Fourier transformation of raw k-space NMR data to produce two or three-dimensional images; the application of filters to a reconstructed image; the performance of a backprojection image reconstruction of acquired NMR data; the calculation of functional MR images; the calculation of motion or flow images, etc.

Images reconstructed by the data processing server 22 are conveyed back to the workstation 10 where they are stored. Real-time images are stored in a data base memory cache (not shown) from which they may be output to operator display 12 or a display 42 which is located near the magnet assembly 30 for use by attending physicians. Batch mode images or selected real-time images are stored in a host database on disc storage 44. When such images have been reconstructed and transferred to storage, the data processing server 22 notifies the data store server 23 on the workstation 10. The workstation 10 may be used by an operator to archive the images, produce films, or send the images via a network to other facilities.

Figure 2:
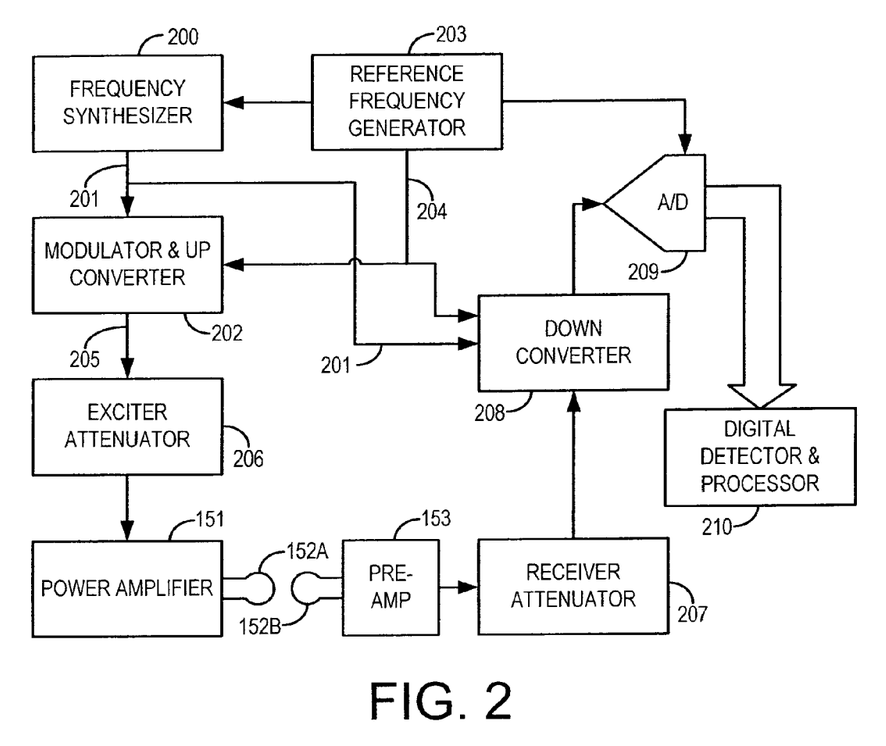
FIG. 2 is a block diagram of a transceiver which forms part of the MRI system of FIG. 1.

As shown in FIG. 1, the RF system 26 may be connected to the whole body RF coil 34 or other local coils or coil arrays, or as shown in FIG. 2, a transmitter section of the RF system 26 may connect to one RF coil 152A and its receiver section may connect to a separate RF receive coil 152B. Further the transmitter section may be connected to the whole body RF coil 34 and each receiver section is connected to a separate local coil 152B. Other multi-channel transmit/receive configurations are also known.

Referring particularly to FIG. 2, the RF system 26 includes a transmitter that produces a prescribed RF excitation field. The base, or carrier, frequency of this RF excitation field is produced under control of a frequency synthesizer 200 that receives a set of digital signals from the pulse sequence server 18. These digital signals indicate the frequency and phase of the RF carrier signal produced at an output 201. The RF carrier is applied to a modulator and up converter 202 where its amplitude is modulated in response to a signal R(t) also received from the pulse sequence server 18. The signal R(t) defines the envelope of the RF excitation pulse to be produced and is produced by sequentially reading out a series of stored digital values. These stored digital values may be changed to enable any desired RF pulse envelope to be produced.

The magnitude of the RF excitation pulse produced at output 205 is attenuated by an exciter attenuator circuit 206 that receives a digital command from the pulse sequence server 18. The attenuated RF excitation pulses are applied to the power amplifier 151 that drives the RF coil 152A. For a more detailed description of this transmitter section reference is made to U.S. Pat. No. 4,952,877 that is incorporated herein by reference.

Referring still to FIG. 2, the signal produced by the subject is picked up by the receiver coil 152B and applied through a preamplifier 153 to the input of a receiver attenuator 207. The receiver attenuator 207 further amplifies the signal by an amount determined by a digital attenuation signal received from the pulse sequence server 18. The received signal is at or around the Larmor frequency, and this high frequency signal is down converted in a two-step process by a down converter 208 that first mixes the NMR signal with the carrier signal on line 201 and then mixes the resulting difference signal with a reference signal on line 204. The down converted NMR signal is applied to the input of an analog-to-digital (A/D) converter 209 that samples and digitizes the analog signal and applies it to a digital detector and a signal processor 210 that produces 16-bit in-phase (I) values and 16-bit quadrature (Q) values corresponding to the received signal. The resulting stream of digitized I and Q values of the received signal are output to the data acquisition server 20. The reference signal as well as the sampling signal applied to the A/D converter 209 are produced by a reference frequency generator 203. For a more detailed description of the receiver, reference is made to U.S. Pat. No. 4,992,736.

Figure 3:
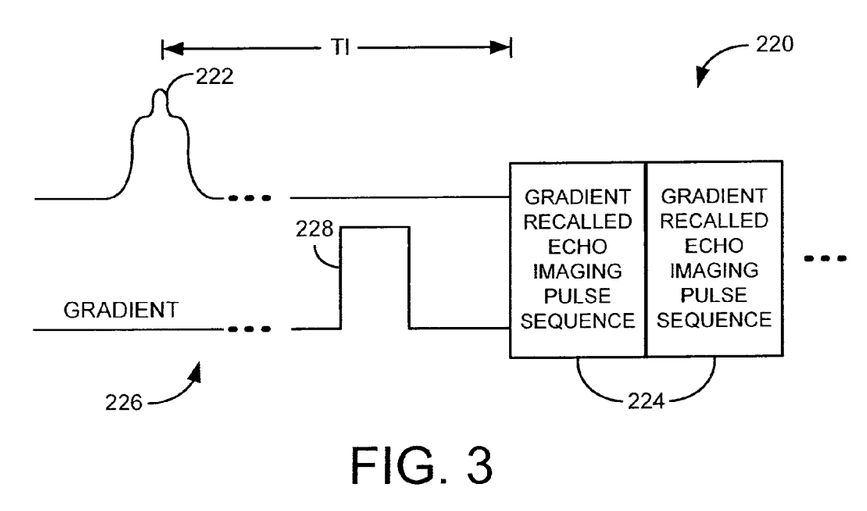
FIG. 3 is a schematic representation pulse sequence for acquiring MRI data in accordance with the present invention using the system of FIGS. 1 and 2.

Referring now to FIG. 3, one embodiment of the present invention employs a modified MP-RAGE pulse sequence for the acquisition of NMR signals from one or more slices in the brain using the MR system 10.

In particular, the modified MP-RAGE pulse sequence includes a preparation stage 226 followed by an imaging stage 220 including one or more fast gradient recalled echo imaging pulse sequences 224. The preparation stage 226 includes an RF inversion pulse 222 that is produced at a time interval (TI) before the commencement of the imaging pulse sequences 224 and in the absence of gradients. The preparation stage 226 may also include a subsequent gradient pulse 228 that serves to dephase the transverse magnetization produced by the RF inversion pulse 222. As is well known in the art, the interval TI is selected to prepare this longitudinal magnetization to provide a prescribed TI weighting to the image data acquired with the imaging pulse sequences 224.

The RF preparatory pulse is an RF inversion pulse having a center frequency that is shifted or offset from a nominal Larmor frequency, i.e., the frequency expected according to $f_0 = \gamma B_0$, where $\gamma = 42.56$ MHz/T for hydrogen, and $B_0$ is the strength of the polarizing magnetic field. In one embodiment, an appropriate shift of approximately 200 Hz from the nominal Larmor frequency at a magnetic field of 7.0 T is provided. The amount of the shift may be determined by performing a spectroscopic scan of a region of interest and analyzing the frequency distribution (such as a histogram) that is obtained.

The imaging stage includes a series of RF excitation pulses as part of sequences indicated generally at 224, each producing a series of gradient recalled echo signals. Each imaging stage 224 is phase encoded once such that it acquires only a single "view", however, it acquires multiple copies of that view. As a result, the imaging pulse sequence 224 is repeated once for each phase encoding value needed to acquire a complete k-space image data set. Typically, the imaging pulse sequence 224 is repeated a number of times equal to the number of phase encoding steps after the preparatory (inversion) pulse sequence 226 and the entire sequence 220 is repeated until the k-space is filled. At each phase encoding step, a number of echoes from 1 to 12 or more are generated.

Once data acquisition is complete, an image can be reconstructed using one of many well known reconstruction methods. The resultant image has reduced artifacts due to magnetic field inhomogeneities caused by magnetic susceptibility effects, as compared to an image obtained using the same pulse sequence with an RF inversion pulse having the same bandwidth but a center frequency which is not shifted from the nominal Larmor frequency.

Figure 4A:
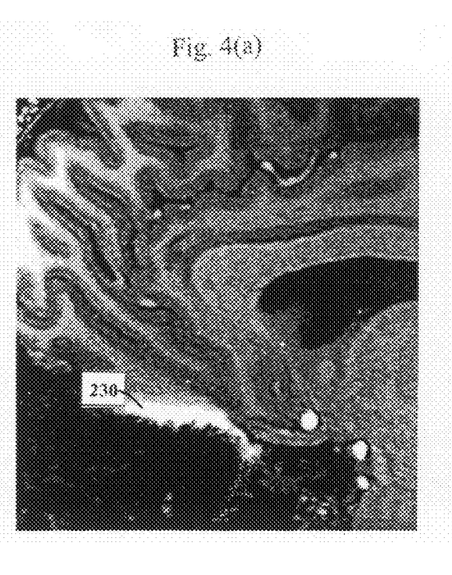
FIGS. 4(a) and 4(b) are images produced using a conventional MP-RAGE pulse sequence and which include artifacts.
Figure 4B:
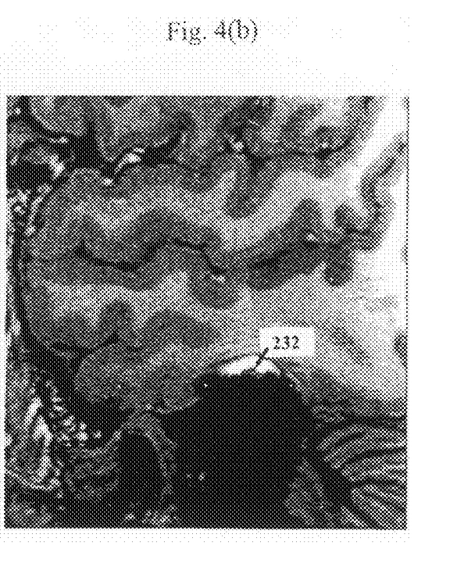

For example, brain images obtained using a conventional MP-RAGE pulse sequence with an RF preparatory pulse having a center frequency at a nominal Larmor frequency includes artifacts such as artifact 230 over the sinuses as seen in FIG. 4(a) or artifact 232 over the ear canals, such as shown in FIG. 4(b). These artifacts can be attributed to poor inversion of the spins in these areas. Such artifacts can often be seen in images produced by 3.0 T MRI systems, but in images produced using a 7.0 T MRI system, these artifacts are even more pronounced.

Figure 5:
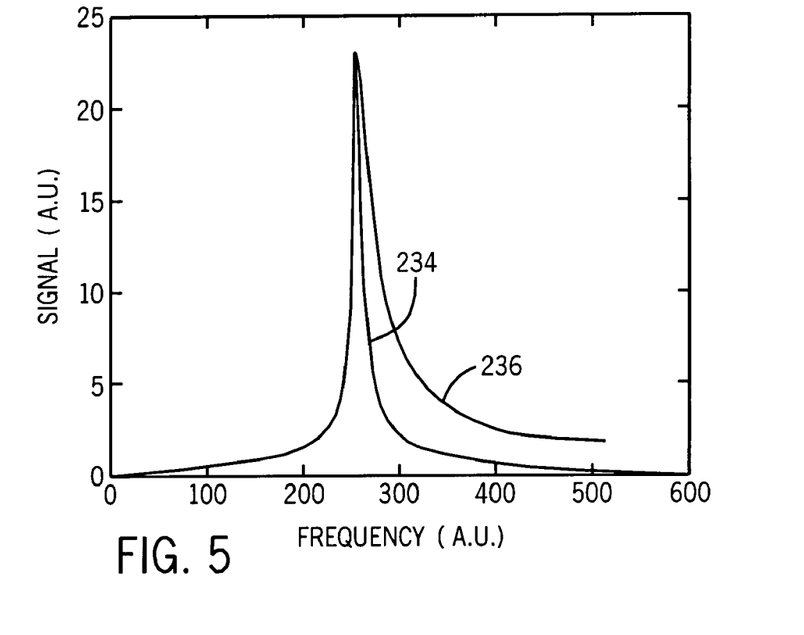
FIG. 5 is an illustration of a frequency distribution of hydrogen in a uniform magnetic field and a frequency distribution of hydrogen in a magnetic field having magnetic susceptibility effects.
Figure 6:
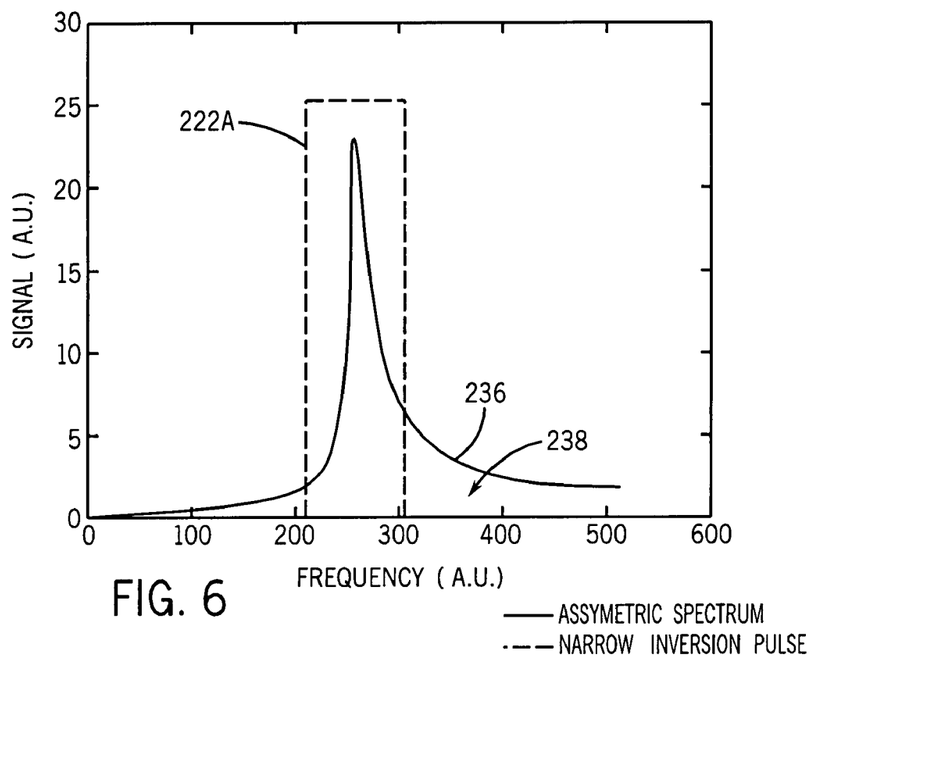
FIG. 6 is an illustration showing how a standard narrow RF inversion pulse does not achieve optimal coverage of an asymmetric frequency distribution.

As illustrated in FIG. 5, the source of these artifacts can be attributed to the magnetic field inhomogeneities that occur in these high-susceptibility regions, which cause frequency offsets in the Larmor frequencies of the hydrogen spin species being imaged. FIG. 5 illustrates a frequency distribution 234 which would be expected with a uniform magnetic field $B_0$ and is centered at the nominal Larmor frequency, and a frequency distribution 236 which is due to magnetic field inhomogeneities from magnetic susceptibility differences, but still has a peak at the nominal Larmor frequency. One realization of the invention is that the frequency distribution 236 of the affected spins is often asymmetric. Thus, if the RF inversion pulse 222A of a conventional MP-RAGE pulse sequence does not cover all the frequency offsets present, such as is illustrated in FIG. 6, some areas such as those denoted by 238 will not be inverted, and the uninverted spins will result in the bright areas (artifacts) on the resultant MP-RAGE images such, as shown in FIGS. 4(a) and 4(b).

Figure 7:
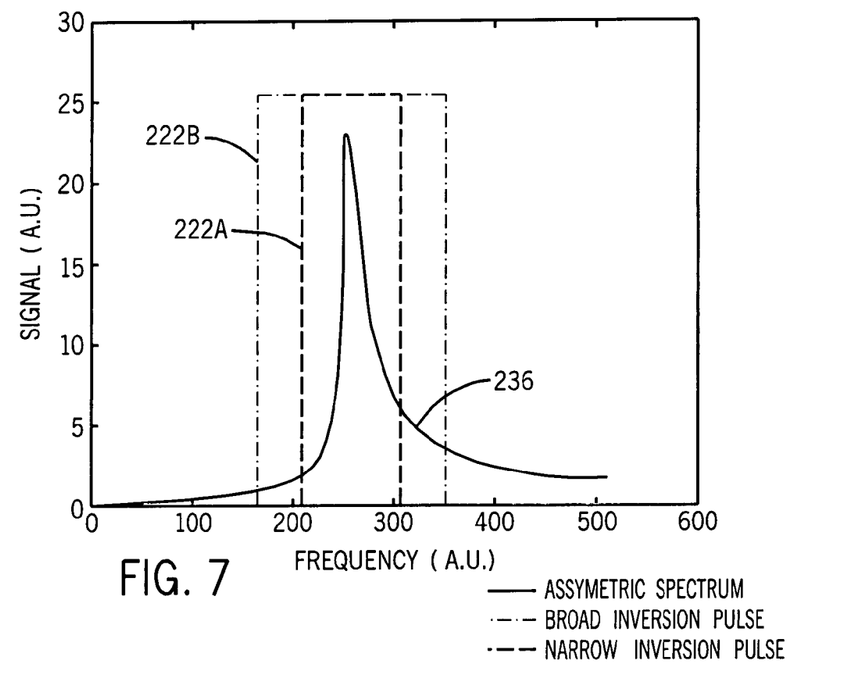
FIG. 7 is an illustration showing how a broader RF inversion pulse provides more coverage of an asymmetric frequency distribution.

As shown in FIG. 7, one solution to achieving good overall inversion is to shorten the inversion pulse, which corresponds to a an RF inversion pulse 222B having a wider bandwidth. However, this solution may not be optimal in that it also increases the RF requirements and SAR, which at 7.0 T are typically already problematic.

Figure 8:
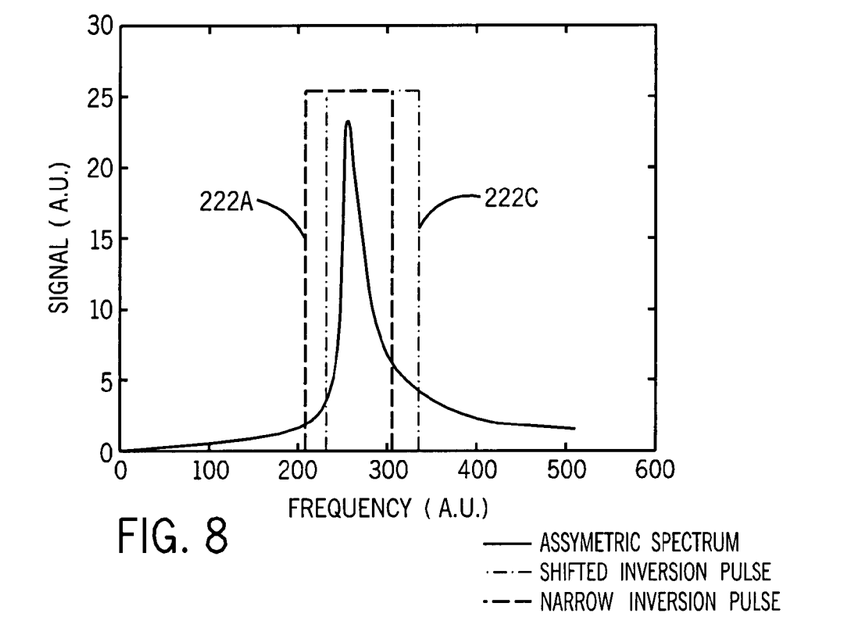
FIG. 8 is an illustration showing how an shifted narrow RF inversion pulse achieves greater coverage than a standard narrow RF inversion pulse.

Thus, as shown in FIG. 8, in the case of an asymmetric frequency distribution, shifting the center frequency of the RF inversion pulse 222A to obtain RF inversion pulse 222C provides better inversion coverage without having to increase its bandwidth. In this manner, no SAR penalties are incurred.

Figure 9:
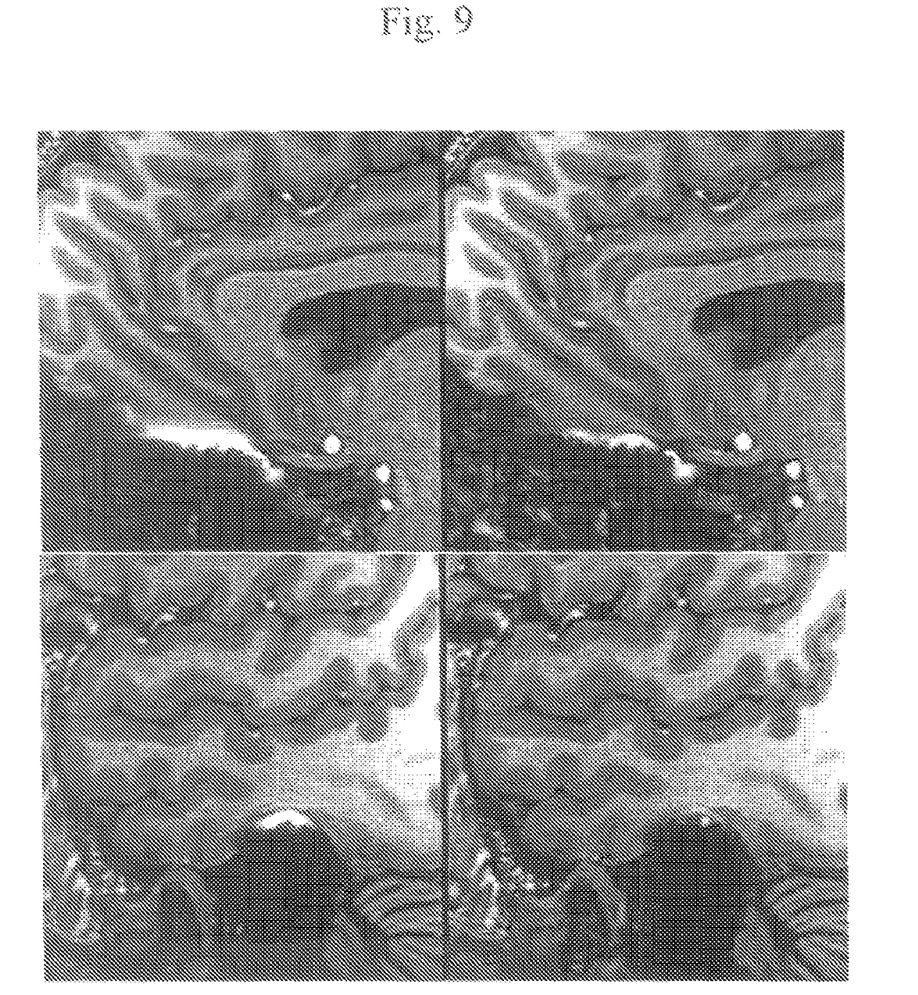
FIG. 9 compares images obtained using a modified MP-RAGE pulse sequence with a shifted (by 200 Hz) narrow RF inversion pulse (right column) to those obtained using a standard MP-RAGE with an unshifted narrow RF inversion pulse (left column) which has the same bandwidth.

As illustrated in FIG. 9, the resultant improved images of a modified MP-RAGE pulse sequence are illustrated in the right column, and are obtained by shifting the RF inversion pulse by approximately 200 Hz. These images can be compared to those in the left column which are obtained using a conventional MP-RAGE pulse sequence without an inversion pulse frequency shift. The top row shows the frontal areas and the lower row shows the medial areas. Specifically, these images are obtained using the following imaging parameters:

FOV 206×240 mm; Matrix 326×448
Slice thickness 1.05 mm; 160 slices
TR 2.6 s
TE 3 ms
TI 1.2 s
Flip angle 9 degrees
Bandwidth 200 Hz/pixel
32 channel head coil.

In summary, shifting the frequency of the RF inversion pulse from a nominal Larmor frequency can provide optimal inversion without SAR or RF power penalties. In cases of larger asymmetry of the frequency distribution, such as at higher magnetic fields, wider inversion bandwidths might still be necessary. However, shifting the inversion pulse frequency can still be used to minimize the SAR costs of such changes.

The present invention has been described in terms of the preferred embodiment, and it should be appreciated that many equivalents, alternatives, variations, and modifications, aside from those expressly stated, are possible and within the scope of the invention. Therefore, the invention should not be limited to a particular described embodiment.

I claim:

1. A method for producing an image of a desired spin species with a magnetic resonance imaging system, the image having reduced artifacts due to B0 field inhomogeneities due to magnetic susceptibility effects, the method comprising:

a) performing a preparatory stage of an MR pulse sequence with the MRI system in which a non-selective RF preparatory pulse is produced having a bandwidth centered at a selected frequency which is offset from a nominal Larmor frequency of the desired spin species being imaged to increase a spectral coverage of the non-selective RF preparatory pulse over a non-selective RF preparatory pulse having a bandwidth centered at the nominal Larmor frequency, and a time period (TI) elapses during which longitudinal spin magnetization recovers; and b) performing an imaging stage of the MR pulse sequence when the TI elapses in which an RF excitation pulse is generated to produce transverse spin magnetization of the desired spin species, and in which a set of NMR signals are acquired that sample k-space; and c) reconstructing an image using the acquired NMR signals.

2. The method of claim 1 wherein the MR pulse sequence is a modified MP-RAGE pulse sequence.

3. The method of claim 1 wherein the RF preparatory pulse is an inversion pulse.

4. The method of claim 1 wherein the RF preparatory pulse is applied in the absence of gradients.

5. The method of claim 1 wherein the desired spin species being imaged is hydrogen in water and the bandwidth of the RF preparatory pulse inverts hydrogen in water and in fat.

6. The method of claim 1, wherein the reconstructed image produced by step c) includes fewer artifacts compared to an image reconstructed using NMR signals acquired using the same MR pulse sequence and the same bandwidth of the RE preparatory pulse, but with the RF preparatory pulse having a center frequency at the nominal the Larmor frequency of the desired spin species being imaged.

7. The method of claim 1 wherein the magnetic resonance imaging system has a magnetic polarizing field $\geqq 3.0$ T.

8. The method of claim 1 wherein the magnetic resonance imaging system has a magnetic polarizing field of 7.0 T.

9. The method of claim 8 wherein the amount of the frequency offset is approximately 200 Hz.

* * * * *